(12) United States Patent
Chen et al.

(10) Patent No.: US 7,312,149 B2
(45) Date of Patent: Dec. 25, 2007

(54) COPPER PLATING OF SEMICONDUCTOR DEVICES USING SINGLE INTERMEDIATE LOW POWER IMMERSION STEP

(75) Inventors: Chao-Lung Chen, Tainan (TW); Kei-Wei Chen, Taipei (TW); Shih-Ho Lin, Tainan (TW); Ying-Lang Wang, Taichung County (TW); Yu-Ku Lin, Hsin-chu (TW); Ching-Hwanq Su, Tainan (TW); Po-Jen Shih, Tainan (TW); Shang-Chin Sung, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 252 days.

(21) Appl. No.: 10/840,095

(22) Filed: May 6, 2004

(65) Prior Publication Data

US 2005/0250327 A1    Nov. 10, 2005

(51) Int. Cl.
  *H01L 21/44*    (2006.01)
(52) U.S. Cl. .................. 438/674; 438/678; 438/687; 257/E21.586
(58) Field of Classification Search ............... 438/674, 438/678, 687
  See application file for complete search history.

(56) References Cited

U.S. PATENT DOCUMENTS

| 5,151,168 | A | 9/1992 | Gilton et al. | |
|---|---|---|---|---|
| 5,662,788 | A | 9/1997 | Sandhu et al. | |
| 5,723,387 | A | 3/1998 | Chen | |
| 6,056,864 | A | 5/2000 | Cheung | |
| 6,074,544 | A | 6/2000 | Reid et al. | |
| 6,140,241 | A | 10/2000 | Shue et al. | |
| 6,297,155 | B1 * | 10/2001 | Simpson et al. | 438/687 |
| 6,746,591 | B2 * | 6/2004 | Zheng et al. | 205/104 |
| 2002/0000379 | A1 * | 1/2002 | Matsuda et al. | 205/96 |
| 2005/0095854 | A1 * | 5/2005 | Uzoh et al. | 438/678 |

OTHER PUBLICATIONS

Sato et al., "Newly Developed Electro-Chemical Polishing Process of Copper as Replacement of CMP Suitable for Damascene Copper Inlaid in Fragile Low-k Dielectrics", Electron Devices Meeting, 2001. IEDM Technical Digest. International, Dec. 2-5, 2001, pp. 4.4.1-4.4.4.

Grandikota et al., "Influence of Plating Parameters on Reliability of Copper Metallization", Interconnect Technology Conference, 2002, Proceedings of the IEEE 2002 International, Jun. 3-5, 2002, pp. 197-199.

* cited by examiner

*Primary Examiner*—Thanh Nguyen
(74) *Attorney, Agent, or Firm*—Duane Morris LLP

(57) ABSTRACT

A method of electroplating a metal layer on a semiconductor device includes a sequence of biasing operations that includes a first electroplating step at a first current density followed by a second immersion step at a second current density being less than the first current density, and subsequent electroplating steps of increasing current densities beginning with a third electroplating step having a third current density that is greater than the first current density. The second, low current density immersion step improves the quality of the plating process and produces a plated film that completely fills openings such as vias and trenches and avoids hollow vias and pull-back on the bottom corners of via and trench openings. The low current density second immersion step produces an electrochemical deposition process that provides low contact resistance and therefore reduces device failure.

21 Claims, 1 Drawing Sheet

COPPER PLATING OF SEMICONDUCTOR DEVICES USING SINGLE INTERMEDIATE LOW POWER IMMERSION STEP

FIELD OF THE INVENTION

The invention relates to processes for the manufacture of semiconductor devices and more particularly to a recipe and processes for the electrochemical deposition of conductive material to fill high aspect ratio vias and the like.

BACKGROUND

Integrated circuits are manufactured by forming discrete semiconductor devices in and over the surfaces of wafers formed of silicon or other suitable materials. A multi-level metallurgical interconnection network is then formed over the devices, contacting their active elements, and wiring them together to create the desired circuits. The wiring layers are formed by depositing an insulating layer over the discrete devices, patterning and etching contact openings into the insulating layer, and then depositing conductive material into the contact openings. A conductive layer is formed over the insulating layer and patterned to form wiring interconnections between the device contacts, thereby creating a first level of basic circuitry. The circuits are further interconnected by additional wiring levels laid out over or within additional insulating layers. The various wiring levels are interconnected by conductive vias that extend through the insulating layers. The conductive vias are produced by first forming via openings in the insulating, or dielectric layers, then filling the via openings with a conductive material. The vias may include high aspect ratios. Depending upon the complexity of the overall integrated circuit, several levels of wiring interconnections may be used.

A method for forming the interconnection layers is the damascene process, whereby openings and trenches comprising an image of the interconnection pattern, are formed in an insulating layer. A metal layer is then deposited into the openings and over the insulating layer. The openings may include high aspect ratios, rendering it difficult to completely fill the openings with the conductive material. The deposited metal is polished back to the insulating layer leaving the metal pattern inlaid within the insulating layer. The polishing back of the metal layer may be accomplished by CMP (chemical mechanical polishing), a relatively old process which has found new application in the planarization of insulating layers and more recently in the damascene process. In single damascene processing, a metal line pattern is generated which connects to subjacent vias or contacts. In dual damascene processing, both vias and contacts and a pattern of interconnection leads are formed by a single metal deposition and CMP. A description of both single and dual damascene processes may be found in Chang, C. Y. and Sze, S. M., "ULSI Technology" McGraw-Hill, New York, (1996), p444-445 and in El-Kareh, B., "Fundamentals of Semiconductor Processing Technologies", Kluwer, Boston (1995), p563-4.

Deposition of the metal layer can be by PVD (physical vapor deposition) methods such as sputtering or vacuum evaporation, by CVD (chemical vapor deposition), or by ECD (electrochemical deposition). The ECD method involves placing the wafer into an electrolyte solution and electroplating a metal layer onto the wafer surface by applying an electric field between the wafer and the electrolyte solution. The ECD method has been found to be particularly desirable for the deposition of copper, the conductive material that is favored as an interconnect medium in advanced semiconductor devices. The metal layer must be deposited to completely fill the via or other opening to ensure good contact resistance between the metal in the via or other opening, and the superjacent and/or subjacent metal that it contacts. Thin seed layers and/or barrier layers may be formed prior to the electrochemical deposition of the bulk metal layer. The electroplating process itself may include a step for seed protection followed by a via fill step, followed, in turn, by a bulk fill step. Conventionally, the electroplating process employs a current density that continuously increases during these steps. Undesirably, this often yields hollow vias or pull-back at the bottom corners of the via or other openings, however. A graph showing successively increasing current densities in a prior art electroplating process is shown in FIG. 1.

Gilton et.al., U.S. Pat. No. 5,151,168 provides an ECD process wherein current densities of less than 1 milliampere/$cm^2$ are used to deposit copper onto a barrier layer to fill contact and via openings. Such low current densities, although producing good quality copper deposits, would predictably have a very low throughput and be unsuited for production uses.

In the electroplating process, additives such as brighteners and levelers may be added to the electrolyte solution to improve the quality and conformality of the deposited metal layer. Such conformality is especially critical when filling openings with high aspect ratios. Brighteners are additives which adsorb onto regions of low electric field and participate in the charge transfer mechanism of the ECD process. Brighteners improve crystalline quality of the deposited metal film but are consumed by the electrochemical process and must therefore be replenished at the growth front during the ECD. In conventional electroplating processes, brighteners are replenished at the reaction front from the bulk of the electrolyte, by normal diffusion assisted by mechanical agitation of the bath containing the electrolyte solution. However, in the presence of high aspect ratio contact/via openings and trenches typically found in current high density integrated circuits, conventional agitation of the electrolyte solution becomes inadequate for timely replenishment of the depleted brighteners at the bases of the openings and trenches. Replenishment of such additives must then rely on diffusion alone, requiring the reduction of deposition current density and thereby the process throughput. The film quality and throughput of current ECD processes are therefore limited by the mass transfer of additives to the deposition front. An inadequate supply of these additives at the deposition front results in reduced mechanical and electrical quality of the electrodeposited metal layer and poor gap filling, i.e., openings with high aspect ratios may be formed to include hollow portions and/or pull-back at the top corners. As such, the use of various additives does not satisfactorily overcome the various shortcomings of known ECD processes.

It is therefore desirable to provide a metal deposition process that is suitable for damascene processing and includes superior deposition characteristics, including the ability to completely fill openings with high aspect ratios.

SUMMARY OF THE INVENTION

To achieve these and other objects and in view of its purposes, the invention provides a method of depositing a metal layer on a semiconductor device formed on a semiconductor wafer. The method includes immersing the wafer in an electrolytic solution that contains metal ions, then biasing the wafer negatively with respect to the electrolytic solution so as to create a current flow between the electrolytic solution and the wafer and thereby electroplate a layer on the wafer. The biasing step includes first biasing the wafer to create a first current density, then secondly biasing the wafer to create a second current density, the second current density being greater than zero and less than the first current density, then thirdly biasing the wafer to create a third current density, the third current density being greater than the first current density.

In another embodiment, the invention provides another method of depositing a metal layer on a semiconductor wafer. The method includes depositing a seed layer on a surface of the wafer and electroplating the metal layer onto the wafer. The electroplating is carried out by first immersing the wafer in a first electrolytic solution containing metal ions and first biasing the wafer negatively with respect to the first electrolytic solution so as to create a current flow and a first current density. The wafer is then immersed in a second electrolytic solution containing metal ions and secondly biased negatively with respect to the second electrolytic solution so as to create a second current flow and a second current density, the second current density being greater than zero and less than the first current density. Next, the method provides for immersing the wafer in a third electrolytic solution containing metal ions, and thirdly biasing the wafer negatively with respect to the third electrolytic solution so as to create a third current flow and a third current density, the third current density being greater than the first current density.

In another embodiment, the invention provides a process recipe for electroplating a metal film onto a substrate by electrochemical deposition. The recipe includes a first step with a first bias to create a first current density between the substrate and an electrolytic solution, a second step following the first step and having a second bias to create a second current density between the substrate and the electrolytic solution, the second current density being greater than zero and less than the first current density, and subsequent steps of continuously increasing current densities beginning with a third step that follows the second step and has a third bias that creates a third current density between the substrate and the electrolytic solution, the third current density being greater than the first current density.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included are the following figures.

DETAILED DESCRIPTION

Figure 1:
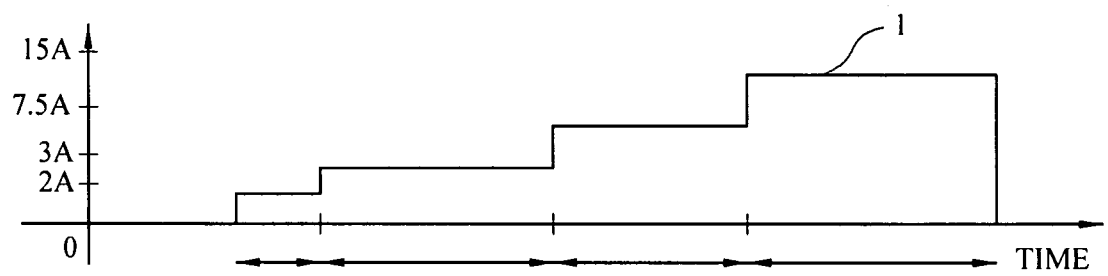
FIG. 1 is a graph showing successively increasing current densities in a PRIOR ART electrochemical deposition process.

The present invention provides a process recipe and an electrochemical deposition method for electroplating a conductive film such as copper on the surface of a substrate such as a semiconductor wafer using a sequence of processing steps that generally includes increasing current densities except for the second immersion step that includes a lessened current density with respect to the first step. FIG. 1 is a graph showing a conventional electrochemical deposition process sequence according to the prior art, and shows that current 1 and therefore the current density successively increases during the electroplating sequence.

Figure 2:
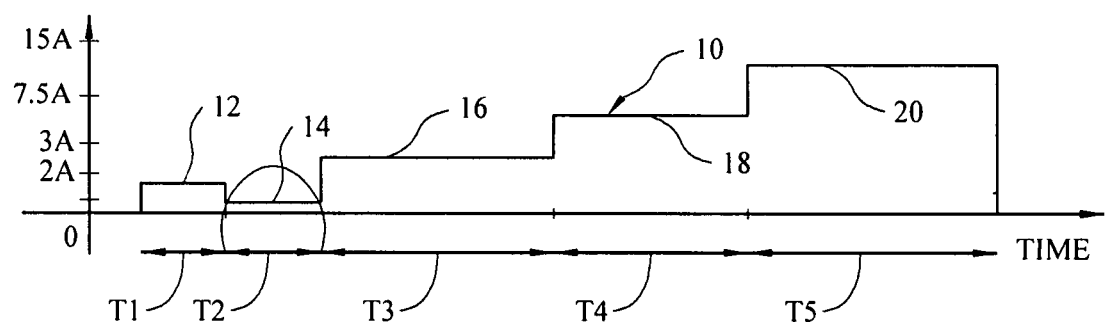
FIG. 2 is a graph showing the sequence of current densities used in an exemplary electrochemical deposition operation according to the present invention.

FIG. 2 is a graph showing an exemplary electrochemical deposition method according to the present invention. The method may be used to electroplate a conductive film onto a surface of a semiconductor device formed on a semiconductor wafer. The surface may be a dielectric or other surface. The surface may be a relatively planar surface or a conformal, topographically varying surface and the surface may include a plurality of openings that extend downwardly from an upper plane of the surface. The openings may be via openings or single or dual damascene openings, the dual damascene openings including a trench section and a via section extending down from the trench section. In an exemplary embodiment, the openings may include a width no greater than 0.25 microns, but other dimensions may be present in other exemplary embodiments.

The semiconductor wafer is immersed in an electrochemical bath containing an electrolyte solution containing metal ions, and a bias is applied to the wafer using conventional methods. The bias may be applied using DC or it may be pulsed. The wafer is biased negatively with respect to the electrolyte solution so as to create a current flow between the electrolyte solution and the wafer and to thereby electrochemically deposit, i.e., electroplate a layer on the surface of the wafer. The electrolyte solution includes metal ions and the biasing of the wafer produces an electric field between the wafer and the electrolytic solution. In an exemplary embodiment, the metal ions may be copper ions plated onto the surface to form a copper film when a bias is applied. The metal ions may be from salts such as copper salts contained in the electrolytic solution and the electrolytic solution may additionally include an accelerator and/or a suppressor. In an exemplary embodiment, the accelerator may be present at a concentration of about 1-16 milliliters per liter and the suppressor may be present at a concentration of about 1-10 milliliters per liter of electrolyte solution. Various suitable accelerators and suppressors are available and may be used, and other conventional additives may also be used. The wafer is placed in an electrolyte solution in an electrochemical bath of various volumes and configurations and in an exemplary embodiment, the electrolyte solution may flow through the bath or be recirculated through the bath at a flow rate of about 5-20 liters per minute, most desirably 6-12 liters per minute. In other exemplary embodiments, the solution flow rate may vary depending on the bath volume, wafer size and the like. Conventional methods may be used to maintain the bath at a suitable temperature which may range from 21 to 27° Celsius in one exemplary embodiment. The wafer may be placed in the bath containing the electrolytic solution, at various orientations.

Before the wafer is introduced to the electrolyte solution, a thin conductive barrier/seed layer may optionally be deposited onto the wafer, for example, by ionized PVD, such as by IMP (Ion Metal Plasma) sputtering. The optional seed layer may include conventional barrier materials and/or a copper film that assists in the initiation of the subsequent electrochemical deposition of the conductive film.

FIG. 2 shows a graph of an exemplary electroplating process sequence according to the present invention. Since the process by which electroplating takes place is called an electrochemical deposition process, FIG. 2 may alternatively be considered to illustrate an electrochemical deposition process sequence of the invention. It can be seen that the process recipe consists of a series of steps, each having a constant current level. The graph in FIG. 2 depicts current as a function of time during an exemplary electroplating operation. Since the wafer is biased negatively with respect to the electrolyte solution to produce a current and an associated current density at the wafer surface in the bath, the current and current density are directly proportional to each other and the applied bias voltage in an electrolyte bath in which a substantially steady state metal ion concentration is maintained. As such, although the graph in FIG. 2 is a plot of current in the electrolyte bath versus time, the ordinate could alternatively be expressed in current density or applied bias since these parameters vary directly with one another. The bath may be a dynamic bath and for the exemplary recipe shown in FIG. 2, may include a solution flow rate of about 8 liters per minute. The electrochemical deposition operation consists of a plurality of steps: first step 12, second step 14, third step 16, fourth step 18, and fifth step 20. In other exemplary embodiments, additional steps may be used after fifth step 20 and these additional steps will continue to successively increase in current level. First step 12 takes place for a time T1 which may range from 1-15 seconds in an exemplary embodiment. Second step 14 may take place for a time T2 ranging from 1-30 seconds in an exemplary embodiment and third step 16 may take place for a time T3 ranging from 11-60 seconds in an exemplary embodiment. In an exemplary embodiment, fourth step 18 may take place for a time T4 of about 15-25 seconds and time T5 for fifth step 20 may be about 21-24 seconds. Each of the aforegiven times are intended to be exemplary only and various times and various relative times may be used in other exemplary embodiments.

The graph in FIG. 2 shows that, for each process step, the current value remains constant throughout the step. First step 12 includes a first current level and second step 14 includes a second current level that is less than the first current level and greater than zero. Similarly, the current density and applied bias in second step 14 will be less than that in first step 12 in a steady-state electrolyte solution. Third step 16 includes a third current level greater than the first current level of first step 12. Subsequent steps successively increase in current level and current density. In an exemplary embodiment, the electrolyte bath and bias may be controlled such that the current density at the wafer surface during second step 14 is less than 0.0016 amps/cm$^2$. Also in an exemplary embodiment, the current density in first step 12 may be about 0.003 to 0.08 amps/cm$^2$ and the current density in third step 16 may range from about 0.003 to 0.08 amps/cm$^2$. In one embodiment, the film deposition rate during the second, immersion, step 14 may be less than 45-50 Å/minute, and the average film deposition rate during steps 3-5, may be over 5500 Å/minute. The film deposition rate during second step 14 may be controlled to be less than 0.01 as great as the bulk film deposition rate, that is, the average film deposition rate during subsequent deposition steps.

In an exemplary embodiment, the electroplating process illustrated by FIG. 2, takes place in-situ in a single bath and in another exemplary embodiment, at least one of the steps 12-20 may take place ex-situ, i.e. in another bath containing another electrolyte solution.

Figure 3:
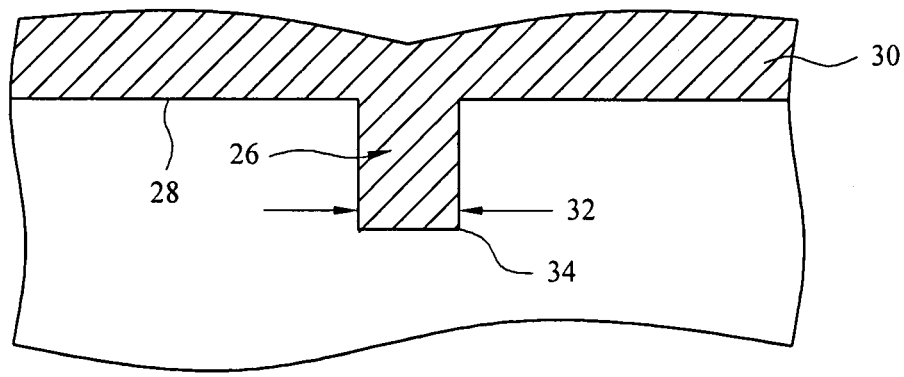
FIG. 3 is a cross sectional view showing an opening in a dielectric film filled by a conductive material according to an exemplary electrochemical deposition process of the present invention.

The process sequence shown in FIG. 2, including five distinct steps, is intended to be exemplary only and in other exemplary embodiments, more or less than five distinct processing steps, i.e. discrete biasing levels, may be used. The second, low current density immersion step, facilitates the deposition of a plated film that completely fills openings formed on surfaces of semiconductor devices. FIG. 3 is a cross-sectional view showing an exemplary via opening 26 formed to extend downwardly from surface 28 of a semiconductor device formed on a wafer. Via opening 26 may include a width 32 no greater than 0.25 microns in one exemplary embodiment. Electroplated metal film 30 is formed over surface 28 and fills via opening 26 such that via opening 26 is free of hollow or void sections and does not exhibit pull-back on its bottom corners 34. The completely filled via provides a suitably low contact resistance. Further processing operations such as chemical mechanical polishing (CMP) may be used to planarize the structure and result in a completely filled via plug which may be further processed using conventional methods, to function as interconnect structures for semiconductor devices. The filled via plug is intended to be exemplary only and the electroplated conductive film of the present invention may be formed over various surfaces and in various openings.

The preceding merely illustrates the principles of the invention. It will thus be appreciated that those skilled in the art will be able to devise various arrangements which, although not explicitly described or shown herein, embody the principles of the invention and are included within its spirit and scope. For example, the recipe and process of the invention may be used to electroplate various conductive films other than copper, on various substrates. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of depositing a metal layer on a wafer, the method comprising:

immersing the wafer in an electrolytic solution containing metal ions; and biasing the wafer negatively with respect to, the electrolytic solution so as to create a current flow between the electrolytic solution and the wafer and thereby electroplate a metal layer on a surface of the wafer in a continuous electroplating operation that continuously deposits the metal layer on the surface by first biasing the wafer to produce a first current density, then secondly biasing the wafer to produce a second current density, the second current density being greater than zero and less than the first current density, then thirdly biasing the wafer to produce a third current density, the third current density being greater than the first current density, the first biasing being the initial step in the continuous electroplating operation.

2. The method as in claim 1, wherein, after the secondly biasing, the second current density is no longer used.

3. The method as in claim 1, wherein the biasing the wafer negatively includes, after the thirdly biasing, further electroplating using a succession of steps of increasing current densities, the succession of steps beginning with a fourth step having a fourth current density being greater than the third current density.

4. The method as in claim 3, wherein a film deposition rate produced by the second current density is less than 0.01 times as great as an average film deposition rate during the thirdly biasing and the succession of steps.

5. The method as in claim 1, wherein the first biasing, the secondly biasing, and the thirdly biasing are carried out in-situ.

6. The method as in claim 1, wherein the first current density lies within a range of 0.003 to 0.08 amps/cm$^2$ and the third current density lies within a range of about 0.003 to 0.08 amps/cm$^2$.

7. The method as in claim 1, wherein the second current density is no greater than 0.0016 amps/cm$^2$.

8. The method as in claim 7, wherein the secondly biasing takes place for a time of 1 to 30 seconds.

9. The method as in claim 1, wherein the second current density produces a film deposition rate no greater than 45 Å/minute.

10. The method as in claim 1, wherein the first biasing takes place for a first time of 1 to 15 seconds and the secondly biasing takes place for a second time of 1 to 30 seconds.

11. The method as in claim 1, wherein the metal ions are copper ions and the metal layer comprises copper.

12. The method as in claim 1, wherein the surface includes an upper portion and an opening extending downwardly therefrom and the biasing the wafer negatively produces the metal layer substantially completely filling the opening.

13. The method as in claim 12, wherein the opening is a via that includes a width no greater than 0.25 microns.

14. The method as in claim 1, wherein the electrolytic solution is in a bath and includes a flow rate of 5-20 liters per minutes.

15. The method as in claim 1, wherein the electrolytic solution includes an accelerator having a concentration of about 1-16 milliliters/liter and a suppressor having a concentration of about 1-10 milliliters/liter.

16. The method as in claim 1, further comprising depositing a seed layer on the surface prior to the biasing.

17. A method of electrochemically depositing a metal layer on a wafer, the method comprising:

depositing a seed layer on a surface of the wafer;

electroplating the metal layer on the wafer by:

first immersing the wafer in a first electrolytic solution containing metal ions and first biasing the wafer negatively with respect to the first electrolytic solution so as to create a first current flow and a first current density, the first immersing being the initial step in the electroplating and a continuous operation in which said first current flow and said first current density are constantly maintained;

then immersing the wafer in a second electrolytic solution that contains metal ions and secondly biasing the wafer negatively with respect to the second electrolytic solution so as to create a second current flow and a second current density, the second current density being greater than zero and less than the first current density; and then immersing the wafer in a third electrolytic solution that contains metal ions and thirdly biasing the wafer negatively with respect to the third electrolytic solution so as to create a third current flow and a third current density, the third current density being greater than the first current density.

18. The method as in claim 17, wherein immersing the wafer in a second electrolytic solution takes place for a time of 1 to 30 seconds and includes the second current density being no greater than 0.0016 amps/cm$^2$.

19. A process recipe for electroplating a metal film onto a wafer by a continuous electrochemical deposition operation, comprising a first step with a first bias to create a first current density between the substrate and an electrolytic solution, a second step following the first step and having a second bias to create a second current density between the substrate and the electrolylic solution, the second current density being greater than zero and less than the first current density, and subsequent steps of continuously increasing current densities beginning with a third step that follows the second step and has a third bias that creates a third current density between the substrate and the electrolytic solution, the third current density being greater than the first current density, and the first step being the initial step in the continuous electrochemical deposition operation.

20. The process recipe as in claim 19, wherein the second current density is no greater than 0.0016 amps/cm$^2$ and produces a deposition rate less than about 50 Å/minute.

21. The process recipe as in claim 19, wherein the second step includes a time of 1 to 30 seconds, the first current density lies within a range of 0.003 to 0.08 amps/cm$^2$ and the third current density lies within a range of about 0.003 to 0.08 amps/cm$^2$.

* * * * *

UNITED STATES PATENT AND TRADEMARK OFFICE
CERTIFICATE OF CORRECTION

PATENT NO. : 7,312,149 B2  Page 1 of 1
APPLICATION NO. : 10/840095
DATED : December 25, 2007
INVENTOR(S) : Chao-Lung Chen et al.

It is certified that error appears in the above-identified patent and that said Letters Patent is hereby corrected as shown below:

Column 8, line 42, Claim 19, delete "electrolylic" and insert -- electrolytic -- therefor.

Signed and Sealed this

Thirteenth Day of May, 2008

JON W. DUDAS
*Director of the United States Patent and Trademark Office*